United States Patent
Yoon et al.

(10) Patent No.: US 11,454,556 B2
(45) Date of Patent: Sep. 27, 2022

(54) SECONDARY BATTERY STATIC PRESSURE JIG AND SECONDARY CELL INTERNAL PRESSURE CONTROL METHOD USING THE SAME

(71) Applicant: LG CHEM, LTD., Seoul (KR)

(72) Inventors: Jong Keon Yoon, Daejeon (KR); Hoejin Hah, Daejeon (KR); Jeongbeom Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 246 days.

(21) Appl. No.: 16/652,515

(22) PCT Filed: Mar. 15, 2019

(86) PCT No.: PCT/KR2019/003054
§ 371 (c)(1),
(2) Date: Mar. 31, 2020

(87) PCT Pub. No.: WO2019/208929
PCT Pub. Date: Oct. 31, 2019

(65) Prior Publication Data
US 2021/0033474 A1 Feb. 4, 2021

(30) Foreign Application Priority Data
Apr. 25, 2018 (KR) .......... 10-2018-0048098

(51) Int. Cl.
*H02J 7/00* (2006.01)
*G01L 1/16* (2006.01)
(Continued)

(52) U.S. Cl.
CPC .............. *G01L 1/16* (2013.01); *G01R 31/396* (2019.01); *H01M 10/48* (2013.01)

(58) Field of Classification Search
USPC .................. 320/132, 134, 135, 136
See application file for complete search history.

(56) References Cited

U.S. PATENT DOCUMENTS

| 5,377,547 A | 1/1995 | Kusakabe et al. |
| 7,507,498 B2 | 3/2009 | Yoon et al. |
| (Continued) | | |

FOREIGN PATENT DOCUMENTS

| CN | 204315599 U | * | 5/2015 | |
| CN | 104904033 A | * | 9/2015 | .......... B60L 11/1861 |
| (Continued) | | | | |

OTHER PUBLICATIONS

Extended European Search Report for European Application No. 19793050.6, dated Jan. 28, 2021.
(Continued)

*Primary Examiner* — Brian Ngo
(74) *Attorney, Agent, or Firm* — Birch, Stewart, Kolasch & Birch, LLP

(57) ABSTRACT

A secondary battery static pressure jig and a secondary cell internal pressure control method using the same is provided. The secondary battery static pressure jig, includes: a supporting member disposed on both surfaces of a battery cell to support the battery cell; a piezoelectric element that is disposed on at least one of surfaces of the supporting member and the battery cell contacting each other and measures a pressure applied to the battery cell; and a controlling part that controls a volume of the piezoelectric element according to the pressure measured by the piezoelectric element, wherein a volume of the piezoelectric element may be changed according to the volume change of the battery cell, and the pressure applied to the battery cell from the supporting member by the volume change of the piezoelectric element may be made to be a constant pressure.

15 Claims, 6 Drawing Sheets

(51) Int. Cl.
   *G01R 31/396* (2019.01)
   *H01M 10/48* (2006.01)

(56) References Cited

U.S. PATENT DOCUMENTS

| | | | |
|---|---|---|---|
| 7,595,128 B2 | 9/2009 | Lee et al. | |
| 7,994,690 B2 | 8/2011 | Wolfer et al. | |
| 9,472,797 B2 * | 10/2016 | Han | H01M 50/20 |
| 2012/0189879 A1 * | 7/2012 | Fetzer | H01M 10/42 |
| | | | 429/61 |
| 2017/0052074 A1 | 2/2017 | Watazu et al. | |
| 2018/0040926 A1 * | 2/2018 | Keser | H01M 10/0436 |
| 2018/0248232 A1 | 8/2018 | Yoon | |

FOREIGN PATENT DOCUMENTS

| | | | | |
|---|---|---|---|---|
| CN | 205822433 U | * | 12/2016 | |
| CN | 107112607 A | * | 8/2017 | H01M 10/627 |
| CN | 107452973 A | * | 12/2017 | G01L 1/18 |
| JP | 6-94561 A | | 4/1994 | |
| JP | 2008-531998 A | | 8/2008 | |
| JP | 2017-27774 A | | 2/2017 | |
| KR | 10-2006-0110576 A | | 10/2006 | |
| KR | 10-2007-0056494 A | | 6/2007 | |
| KR | 10-2016-0064871 A | | 6/2016 | |
| KR | 10-2016-0105540 A | | 9/2016 | |
| KR | 10-2016-0123079 A | | 10/2016 | |
| KR | 10-2017-0084789 A | | 7/2017 | |
| WO | WO-2006112639 A1 | * | 10/2006 | H01M 10/4207 |
| WO | WO-2011023445 A1 | * | 3/2011 | H01M 10/0525 |
| WO | WO 2017/213332 A2 | | 12/2017 | |

OTHER PUBLICATIONS

International Search Report (PCT/ISA/210) issued in PCT/KR2019/003054, dated Jul. 5, 2019.

* cited by examiner

SECONDARY BATTERY STATIC PRESSURE JIG AND SECONDARY CELL INTERNAL PRESSURE CONTROL METHOD USING THE SAME

CROSS-REFERENCE WITH RELATED APPLICATION(S)

This application claims priority to and the benefit of Korean Patent Application No. 10-2018-0048098 filed in the Korean Intellectual Property Office on Apr. 25, 2018, the entire contents of which are incorporated herein by reference.

The present invention relates to a secondary battery static pressure jig and a secondary cell internal pressure control method using the same, and more particularly, to a secondary battery static pressure jig using a piezoelectric element and a secondary battery internal pressure control method using the same.

TECHNICAL FIELD

Background Art

In modern society, in accordance with the daily use of portable devices such as a mobile phone, a laptop computer, a camcorder, a digital camera, and the like, technologies of a field related to the portable devices have been actively developed, and the necessity to develop a secondary battery used for the portable devices has increased.

Examples of the secondary battery include a nickel-cadmium battery, a nickel-hydrogen battery, a nickel-zinc battery, a lithium secondary battery, and the like, and the secondary battery may be manufactured through a process of assembling a cell and a process of activating a cell. The cell activating process stabilizes a battery structure through processes of charging, aging, and discharging of the assembled battery, and makes the battery structure usable. Specifically, in the cell activating process, the cell is mounted on a predetermined pressing jig for smooth current conduction, and then processes such as charging and discharging are performed under conditions necessary for battery activation. The pressing jig is used for testing performance of the manufactured secondary battery in advance, and also prevents an increase in a thickness of the battery cell, thereby reducing adverse effects on battery cell performance.

However, in the case in which the pressure jig is used in the process step, when the pressure jig is pressed at a constant force without considering a change in the thickness of the battery cell due to internal expansion of the battery cell or the like, an excessive strong pressure is applied in accordance with the internal expansion of the battery cell, thereby causing problems. In order to solve such a problem, it is necessary to maintain the pressure applied to the cell to be charged and discharged to be constant.

DISCLOSURE

Embodiments of the present invention have been proposed in order to solve the above-mentioned problems of the previously proposed methods, and the objects thereof are to measure a pressure with a piezoelectric element, which measures the pressure, included in a jig used in charging and discharging tests of a secondary battery, and to maintain a pressure inside the secondary battery at a constant pressure by controlling a volume of the piezoelectric element in accordance with the measured pressure and using a volume change of the piezoelectric element.

However, the objective of the present invention is not limited to the aforementioned one, and may be extended in various ways within the spirit and scope of the present invention.

An embodiment of the present invention provides a secondary battery static pressure jig, including: a supporting member disposed to support opposite surfaces of a battery cell to apply pressure to the battery cell: a piezoelectric element disposed between a surface of the supporting member and one of the opposite surfaces of the battery cell contacting each other to measure a pressure applied to the battery cell; and a controller configured to control a volume of the piezoelectric element according to the pressure measured by the piezoelectric element, wherein the volume of the piezoelectric element may be changed according to a volume change of the battery cell, and wherein the pressure applied to the battery cell by the supporting member is made to be a constant pressure by a volume change of the piezoelectric element.

The controller may include: a converter configured to convert a pressure value measured by the piezoelectric element into a first voltage signal a calculator configured to calculate a second voltage signal for changing the battery cell to an initial pressure state using the first voltage signal: and a driver configured to drive the piezoelectric element according to the second voltage signal.

The calculator may be configured to: calculate a difference between a first pressure value corresponding to the first voltage signal and a second pressure value that is an initial pressure of the battery cell, and calculate the second voltage signal corresponding to the calculated difference between the first pressure value and the second pressure value.

The driver may be configured to control the pressure applied to the battery cell by: transmitting the second voltage signal to the piezoelectric element and driving the piezoelectric element according to the second voltage signal to change the volume of the piezoelectric element.

The opposite surface of the battery cell may be an upper surface and a lower surface. The supporting member may include: a first supporting part configured to contact the upper surface of the battery cell; and a second supporting part configured to contact the lower surface of the battery cell.

A coupling part that penetrates the supporting member to couple the first supporting part and the second supporting part to each other may be provided.

The piezoelectric element may be cylindrical.

The piezoelectric elements may be provided in plural.

The controller may be configured to receive the first voltage signal through a first signal line, and the piezoelectric element may be configured to receive the second voltage signal through a second signal line.

A negative electrode included in the battery cell may include lithium metal.

Another embodiment of the present invention provides an internal pressure control method of a battery cell, including: disposing the battery cell in a supporting member to support the battery cell; measuring, by a piezoelectric element disposed between a surface of the supporting member and a surface of the battery contacting each other, a pressure applied to the battery cell; and controlling, by a controller, a volume of the piezoelectric element according to the pressure measured by the piezoelectric element.

The controlling of the volume of the piezoelectric element may include: converting, by a converter of the controller, a pressure value measured by the piezoelectric element into a first voltage signal; calculating, by a calculator of the controller, a second voltage signal for changing the battery cell to an initial pressure state using the first voltage signal; and driving, by a driver of the controller, the piezoelectric element according to the second voltage signal.

The calculating of the second voltage signal may include: converting, by an analog to digital converter, the first voltage signal to a first digital signal; converting the first digital signal into a second digital signal for changing the battery cell into the initial pressure state; converting, by a digital to an analog converter, the second digital signal to a second analog signal; and amplifying, by a signal amplifier, the second analog signal to convert the second analog signal into the second voltage signal.

The calculating of the second voltage signal may include: calculating a difference between a first pressure value corresponding to the first voltage signal and a second pressure value that corresponds to the initial pressure of the battery cell, and calculating the second voltage signal corresponding to the calculated difference between the first pressure value and the second pressure value.

The driving of the piezoelectric element may include controlling the pressure applied to the battery cell by transmitting the second voltage signal to the piezoelectric element, and driving the piezoelectric element according to the second voltage signal to change the volume of the piezoelectric element.

According to the secondary battery static pressure jig proposed in the present invention and the secondary battery internal pressure control method using the same, it is possible to measure a pressure with a piezoelectric element included in a jig used in charging and discharging tests of a secondary battery, and it is possible to maintain a pressure inside the secondary battery at a constant pressure by changing a volume of the piezoelectric element in accordance with the measured pressure.

MODE FOR INVENTION

Figure 1:
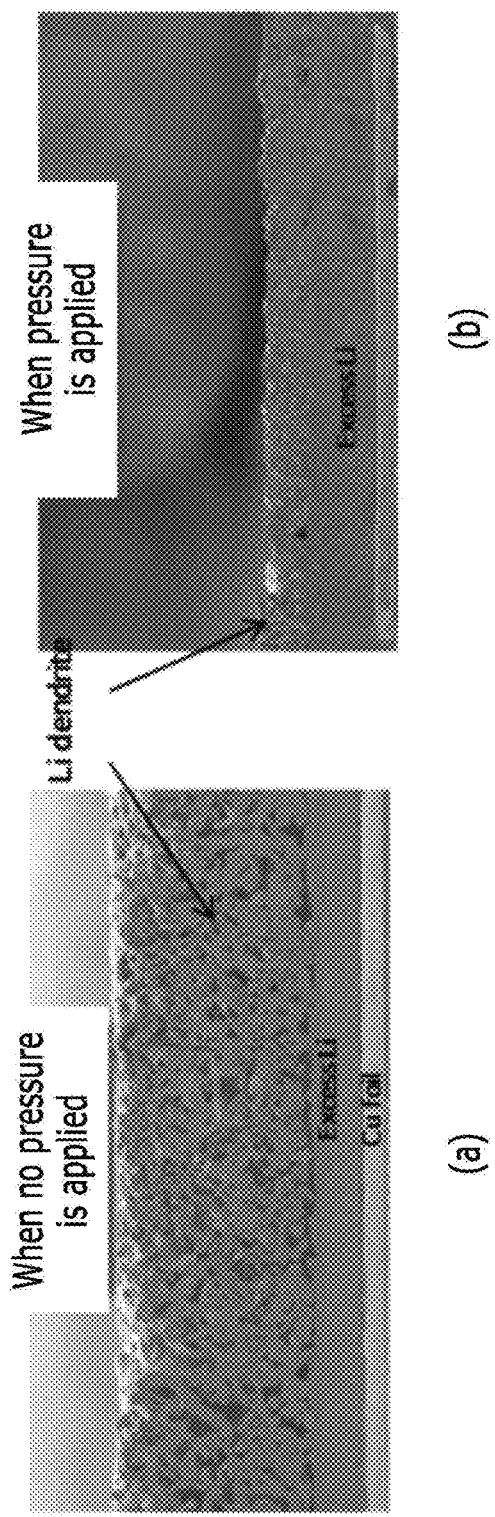
FIG. 1 illustrates a change in thickness of a lithium battery according to whether or not a pressure is applied when the battery is charged.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, throughout the specification, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

Among secondary batteries, particularly, the lithium secondary battery, which is rechargeable and may have a small size and a large capacity, has been widely used in various fields due to a high power capacity and a long lifespan. However, when a pure lithium metal is used as a negative electrode in a lithium secondary battery, since its charging mechanism differs from a typical graphite negative electrode, the thickness expansion of the negative electrode leads to the expansion of the cell, thereby causing a serious problem. In the graphite negative electrode, lithium moved from the positive electrode is intercalated into graphite, which has a layered structure, but it is directly stacked on the lithium metal cathode to increase its thickness. For example, when positive electrode loading of about 4.0 $mAh/cm^2$ is applied, a thickness increase of 20 um occurs. That is, when a 10 um Cu current collector is used with a 20 um lithium negative electrode based on both sides using the positive electrode above, the negative electrode of 50 um (20 um/10 um/20 um) is increased to 90 um per bicell. Considering growth characteristics of the lithium negative electrode, unless the battery cell is pressurized by using a jig when the lithium battery is charged, a thickness change of the cell is further increased.

FIG. 1 illustrates a change in thickness of a lithium battery according to whether or not a pressure is applied when the battery is charged.

FIG. 1(a) shows a case in which no pressure is applied, and FIG. 1(b) shows a case in which a press is applied using a jig. Referring to FIG. 1(a) and FIG. 1(b), it can be seen that the thickness change of the battery increases depending on whether or not the pressure is applied when the lithium battery is charged, and thus, it is possible to confirm necessity to pressurize the battery when the battery is charged or discharged. However, in a case of a conventional pressurizing jig which is pressed with constant force without considering a thickness state of lithium due to lithium expansion or the like, excessive pressure may be applied depending on the thickness change of lithium.

A battery cell according to an embodiment of the present invention may include a negative electrode made of lithium metal, and in order to solve the above-described problem, hereinafter, a positive pressure jig for allowing the pressure applied to the battery to be charged and discharged to be a positive pressure will be described. However, although the necessity of the static pressure jig described below is more significant in an embodiment in which a negative electrode is made of lithium metal, the positive pressure jig according to the embodiment of the present invention and the internal pressure control method of the secondary battery using the positive pressure jig may be applied not only to a battery cell including a negative electrode made of only lithium metal but also to a negative electrode made of graphite.

Figure 2:
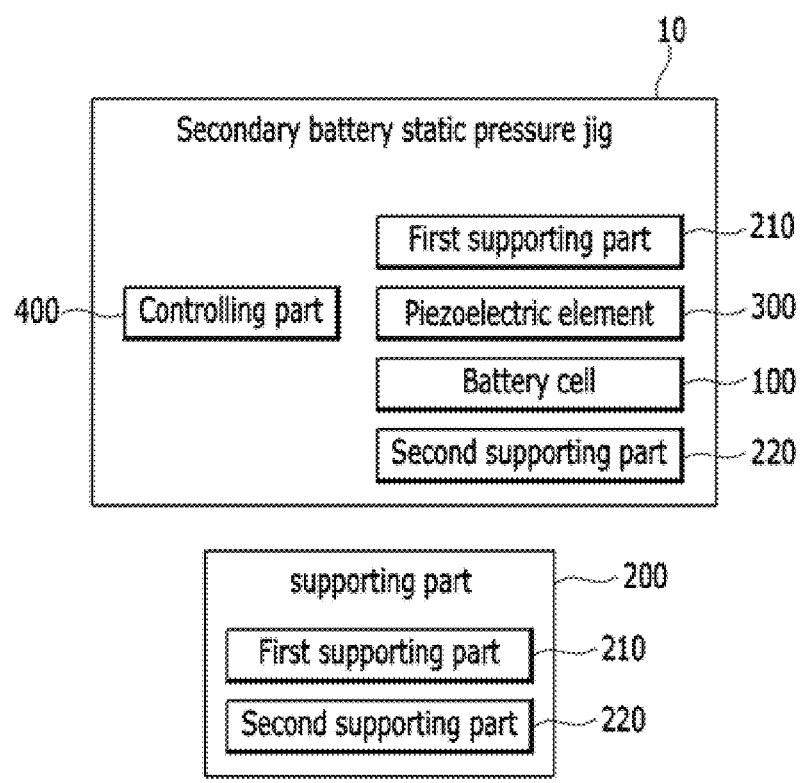
FIG. 2 illustrates a schematic view of a secondary battery static pressure jig according to an embodiment of the present invention.

FIG. 2 illustrates a schematic view of a secondary battery static pressure jig according to an embodiment of the present invention.

As shown in FIG. 2, a secondary battery static pressure jig 10 according to an embodiment of the present invention includes a supporting member 200 disposed to a battery cell 100 to support the battery cell 100, a piezoelectric element 300 for measuring pressure, and a controlling part 400 for controlling a volume of the piezoelectric element 300.

The supporting member 200 is disposed to be in contact with respective surfaces of the battery cell 100 to support the battery cell 100. The supporting member 200 may include a first supporting part 210 contacting an upper surface of the battery cell 100, and a second supporting part 220 contacting a lower surface of the battery cell 100.

The piezoelectric element 300 serves to measure the pressure applied to the battery cell 100. Specifically, the pressure applied to the battery cell 100 by the supporting member 200 is measured. The piezoelectric element is one in which a material having a specific polarization property with a specific material is filled between both electrode plates, and means an element in which a voltage is generated from both electrode plates due to a polarization change of the internal material when a pressure is applied to the specific material. As such, the phenomenon in which the voltage is generated by the pressure is called a piezoelectric effect, and the pressure may be measured using an electrical signal thus generated.

That is, the piezoelectric element 300 measures the applied pressure and changes it to a voltage signal, and transmits the changed voltage signal to a user so that the user may check the measured pressure value.

The piezoelectric element 300 according to the present embodiment may serve not only to measure the pressure but also to control the pressure by pressing through a volume change of the piezoelectric element 300 itself. That is, the pressure may be controlled while measuring the pressure using the piezoelectric element 300. In contrast to the piezoelectric effect that generates the electrical signal from the pressure change (mechanical change) described above, a phenomenon in which a voltage signal (electrical signal) is applied to deform (mechanically change) a material is called an inverse piezoelectric effect, and in the present invention, it is possible to control the volume of the piezoelectric element 300 by using the inverse piezoelectric effect. Specifically, the present invention utilizes effects that the shape and volume of the piezoelectric element 300 are changed by adding a voltage line to the piezoelectric element 300 and inversely transmitting a voltage to the piezoelectric element 300. A specific operational flow of measuring and controlling the pressure using the piezoelectric element 300 will be described with reference to FIG. 4 and FIG. 5 below.

The controlling part 400 serves to control the volume of the piezoelectric element 300 according to the pressure measured by the piezoelectric element 300. As described above, the piezoelectric element 300 of the present invention utilizes both the piezoelectric effect and the inverse piezoelectric effect. That is, the volume of the piezoelectric element 300 according to the present invention is changed, the pressure value measured by the piezoelectric element 300 is changed according to the volume change of the battery cell 100 generated when the battery is charged or discharged, and the volume of the piezoelectric element 300 is changed according to the measured pressure value. The present invention is characterized in that the pressure applied to the battery cell 100 from the supporting member 200 through the volume change of the piezoelectric element 300 becomes a positive pressure. Here, the positive pressure means that the pressure applied to the battery cell is maintained constant.

Figure 3:
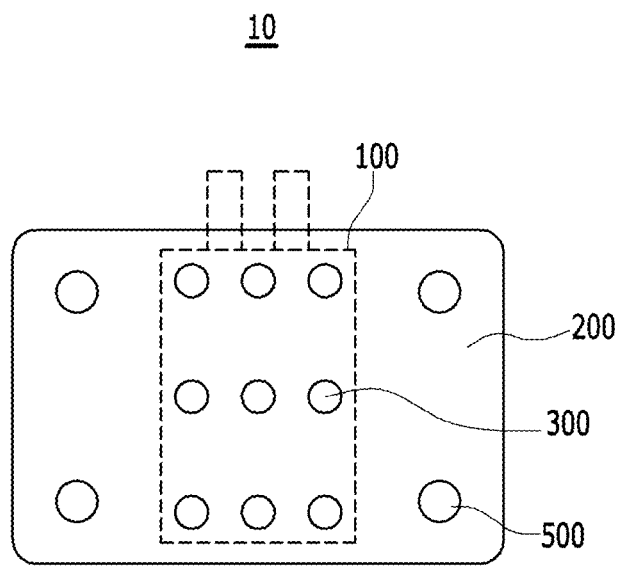
FIG. 3 illustrates a schematic view of a secondary battery static pressure jig according to an embodiment of the present invention.

FIG. 3 illustrates a schematic view of a secondary battery static pressure jig according to an embodiment of the present invention.

As shown in FIG. 3, the supporting member 200 that has a larger area than the battery cell 100 and supports the battery cell 100, and a piezoelectric element 300 that is disposed between the battery cell 100 and the supporting member 200 and is disposed on at least one of surfaces of the battery cell 100 and the supporting member 200 contacting each other, may be included. The piezoelectric element 300 may be a cylindrical piezoelectric element 300, and a plurality of piezoelectric elements 300 may be disposed. For example, as shown in FIG. 3, nine piezoelectric elements 300 may be disposed to the battery cell 100. As such, when a plurality of piezoelectric elements 300 are uniformly disposed on each portion of the battery cell 100, a substantial pressure applied to the entire area of the battery cell 100 may be measured, and the accuracy of the measurement value of the pressure applied to the battery cell 100 is enhanced. The number of piezoelectric elements 300 is not limited, but preferably, about four to nine piezoelectric elements 300 may be disposed. The piezoelectric element 300 in the present invention is not limited to the cylindrical piezoelectric element, but may be a plate-shaped piezoelectric element. That is, the piezoelectric element 300 generates and outputs a voltage signal according to the pressure applied by the volume change of the battery cell 100 during charging and discharging of the battery, and the controlling part 400 that receives the voltage signal transmits a voltage required to reach a constant pressure value to the piezoelectric element 300, and thus it is possible to control the volume of any of the piezoelectric elements 300.

The supporting member 200 described above is disposed on the upper and lower surfaces of the battery cell 100 to support the battery cell 100, and it serves to fix the battery cell 100 so as to prevent the battery cell 100 from moving when the pressure of the battery cell 100 is measured. According to the embodiment, in order to fix the first supporting part 210 and the second supporting part 220 that support the battery cell 100, as shown in FIG. 3, a coupling part 500 that passes through the supporting member 200 and connects the first supporting part 210 and the second supporting part 220 in FIG. 2 may be provided in respective corners of the supporting members 200. The coupling part 500 may be a fixed type using a bolt, but the present invention is not limited thereto, and any of coupling parts 500 that may be movably connected to the piezoelectric element 300 in accordance with a change in pressure applied to the battery cell 100 in accordance with the volume change of the piezoelectric element 300 are possible. In some embodiments, a tension spring may be inserted into the coupling part 500, and in this case, when the volume of the battery cell 100 is reduced, it may have a restoring force to return to an original thickness.

Figure 4:
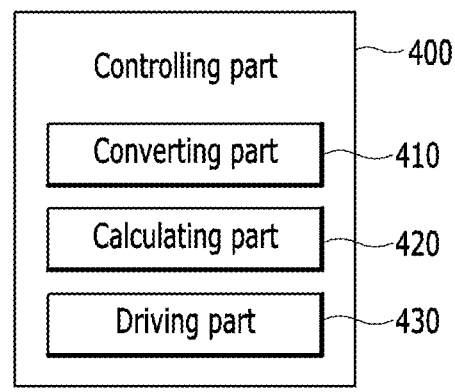
FIG. 4 illustrates a schematic view of a controlling part of a secondary battery static pressure jig according to an embodiment of the present invention.

FIG. 4 illustrates a schematic view of a controlling part of a secondary battery static pressure jig according to an embodiment of the present invention.

The controlling part 400, which controls the volume of the piezoelectric element 300, may include, as shown in FIG. 4, a converting part 410, a calculating part 420, and a driving part 430. The converting part 410 converts the pressure value measured by the piezoelectric element 300 into a first voltage signal, and the calculating part 420 calculates a second voltage signal required to change the battery cell 100 into an initial pressure state using the first voltage signal converted by the converting part 410. Specifically, the calculating part 420 derives a difference between a first pressure value, which is a pressure value corresponding to the first voltage signal converted by the converting part 410, and a second pressure value, which is an initial pressure value of the battery cell 100, and then calculates the second voltage signal corresponding to the difference between the first pressure value and the second pressure value. Here, the initial pressure value may be 0 V, but it is not limited thereto, and it may mean a pressure value initially set by a user.

The driving part 430 drives the piezoelectric element 300 according to the second voltage signal calculated by the calculating part 420. That is, in order to finally control the pressure applied to the battery cell 100, it transmits the second voltage signal calculated by the calculating part 420 to the piezoelectric element 300 so that the piezoelectric element 300 is driven according to the transmitted second voltage signal, and changes the volume of the piezoelectric element 300.

Figure 5:
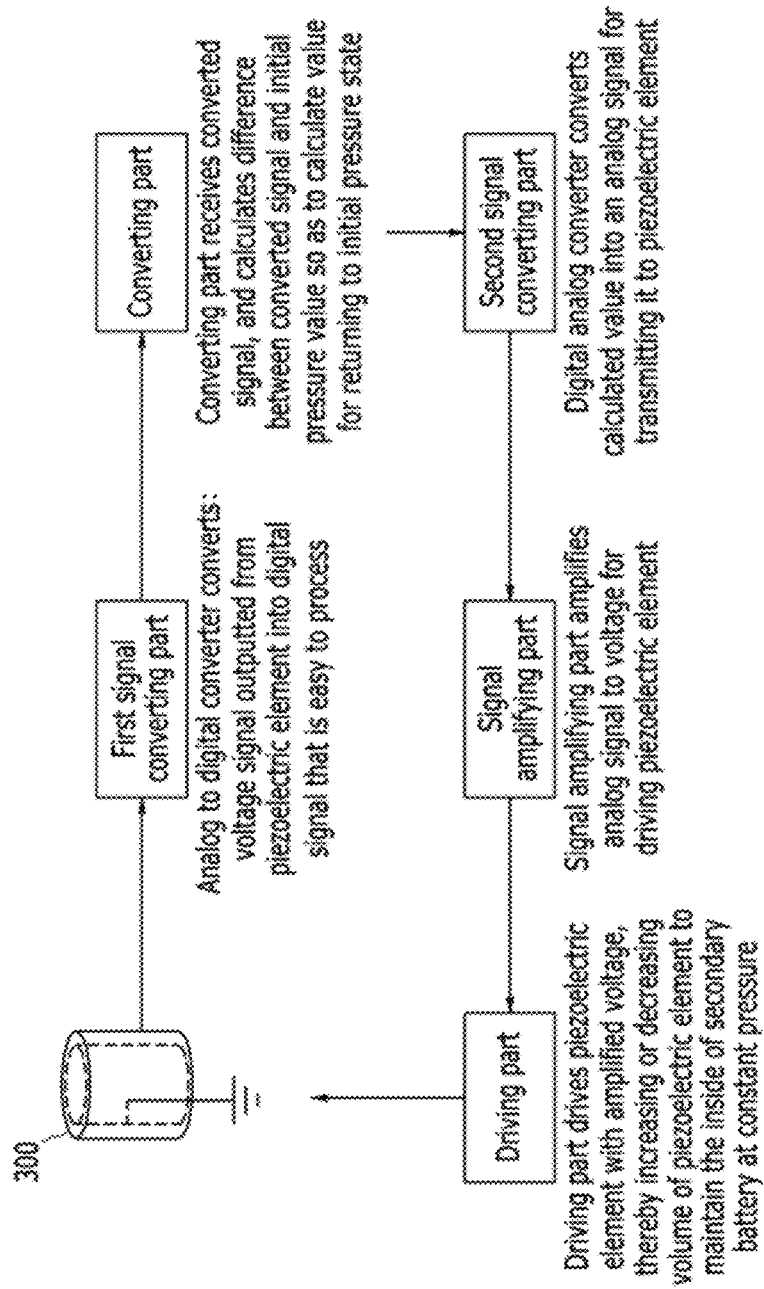
FIG. 5 illustrates an operational flow of a controlling part of a secondary battery static pressure jig according to an embodiment of the present invention.

FIG. 5 illustrates an operational flow of a controlling part of a secondary battery static pressure jig according to an embodiment of the present invention.

FIG. 5 is a diagram illustrating a signal transmission process in the controlling part 400, and as shown in FIG. 5, when a pressure is applied, the piezoelectric element 300 measures the pressure and changes the measured pressure to a voltage signal. The changed voltage signal is converted into a digital signal that is easy to process through a first signal analog to digital converter (ADC) of FIG. 5, and a PID feedback circuit receives the converted signal and calculates a difference between the converted signal and the initial pressure value so as to calculate a value for returning to the initial pressure state. A second signal digital to analog converter (DAC) converts the value calculated by the PID feedback circuit into an analog signal, which is a signal for transmitting the converted value to the piezoelectric element 300, and a signal amplifier amplifies the analog signal to a voltage for driving the piezoelectric element 300. That is, the controlling part 400 receives the first voltage signal of which the pressure measured by the piezoelectric element 300 is converted through a first signal line, and the piezoelectric element 300 receives the second voltage signal calculated by the controlling part 400 through a second signal line.

Finally, the driving part 430 drives the piezoelectric element 300 with the amplified voltage, thereby increasing or decreasing the volume of the piezoelectric element 300 to maintain the inside of the secondary battery at a constant pressure.

Figure 6:
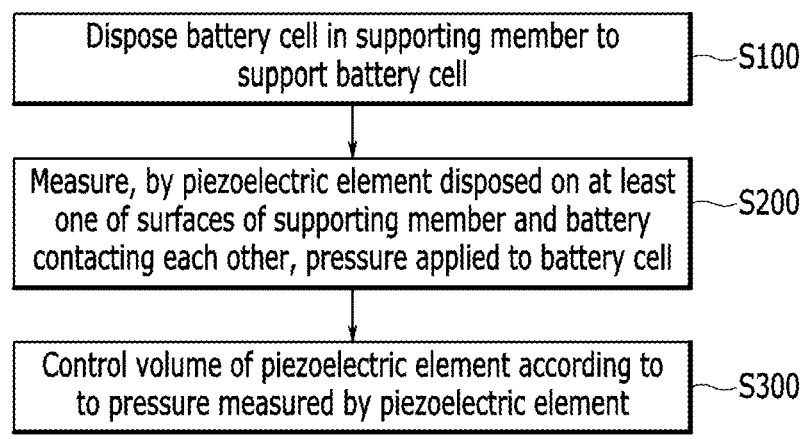
FIG. 6 illustrates a flowchart of a secondary cell internal pressure control method using a secondary cell according to an embodiment of the present invention.

FIG. 6 illustrates a flowchart of a secondary cell internal pressure control method using a secondary cell according to an embodiment of the present invention.

As shown in FIG. 6, the internal pressure control method of the secondary battery according to the embodiment of the present invention includes: disposing a battery cell in a supporting member to support the battery cell (S100); measuring, by a piezoelectric element disposed on at least one of surfaces of the supporting member and the battery contacting each other, a pressure applied to the battery cell (S200), and controlling a volume of the piezoelectric element according to the pressure measured by the piezoelectric element (S300).

Step S300 of controlling the volume of the piezoelectric element may include converting the pressure value measured by the piezoelectric element into a first voltage signal, calculating a second voltage signal for changing the battery cell to an initial pressure state using the first voltage signal, and driving the piezoelectric element according to the second voltage signal.

Specifically, in calculating the second voltage signal, a difference between a first pressure value corresponding to the first voltage signal and a second pressure value that is an initial pressure of the battery cell, may be derived, and the second voltage signal corresponding to a difference between the first pressure value and the second pressure value may be calculated. In driving the piezoelectric element, it is possible to control the pressure applied to the battery cell by transmitting the second voltage signal to the piezoelectric element and driving the piezoelectric element according to the second voltage signal to change the volume of the piezoelectric element.

Detailed contents related to the respective steps have been described in relation to the secondary battery static pressure jig 10 according to the embodiment of the present invention, and a detailed description thereof is thus omitted.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: secondary battery static pressure jig
100: battery cell
200: supporting member
210: first supporting part
220: second supporting part
300: piezoelectric element
400: controlling part
410: converting part
420: calculating part
430: driving part
500: coupling part

The invention claimed is:

1. A secondary battery static pressure jig, comprising:
a supporting member disposed to support opposite surfaces of a battery cell to apply pressure to the battery cell;
a piezoelectric element disposed between a surface of the supporting member and one of the opposite surfaces of the battery cell contacting each other to measure a pressure applied to the battery cell; and a controller configured to control a volume of the piezoelectric element according to the pressure measured by the piezoelectric element, wherein the volume of the piezoelectric element is changed according to a volume change of the battery cell, wherein the pressure applied to the battery cell is made to be a constant pressure by a volume change of the piezoelectric element, wherein one of opposite surfaces of the piezoelectric element contacts the supporting member and the other of opposite surfaces of the piezoelectric element contacts the battery cell, and wherein the piezoelectric element controls the pressure applied to the battery cell by the volume change of the piezoelectric element when a pressure between the battery cell and the supporting member is changed according to the volume change of the battery cell.

2. The secondary battery static pressure jig of claim 1, wherein the controller includes:

a converter configured to convert a pressure value measured by the piezoelectric element into a first voltage signal;

a calculator configured to calculate a second voltage signal for changing the battery cell to an initial pressure state using the first voltage signal; and a driver configured to drive the piezoelectric element according to the second voltage signal.

3. The secondary battery static pressure jig of claim 2, wherein the calculator is configured to:

calculate a difference between a first pressure value corresponding to the first voltage signal and a second pressure value that is an initial pressure of the battery cell; and calculate the second voltage signal corresponding to the calculated difference between the first pressure value and the second pressure value.

4. The secondary battery static pressure jig of claim 2, wherein the driver is configured to control the pressure applied to the battery cell by:

transmitting the second voltage signal to the piezoelectric element; and driving the piezoelectric element according to the second voltage signal to change the volume of the piezoelectric element.

5. The secondary battery static pressure jig of claim 1, wherein the opposite surfaces of the battery cell are an upper surface and a lower surface of the battery cell, and wherein the supporting member includes:

a first supporting part configured to contact the upper surface of the battery cell; and a second supporting part configured to contact the lower surface of the battery cell.

6. The secondary battery static pressure jig of claim 5, further comprising a coupling part that penetrates the supporting member to couple the first supporting part and the second supporting part to each other.

7. The secondary battery static pressure jig of claim 1, wherein the piezoelectric element is cylindrical.

8. The secondary battery static pressure jig of claim 1, wherein the piezoelectric elements is provided in plural.

9. The secondary battery static pressure jig of claim 2, wherein the controller is configured to receive the first voltage signal through a first signal line, and wherein the piezoelectric element is configured to receive the second voltage signal through a second signal line.

10. The secondary battery static pressure jig of claim 1, wherein a negative electrode included in the battery cell comprises lithium metal.

11. An internal pressure control method of a battery cell, comprising:

disposing the battery cell in a supporting member to support the battery cell;

measuring, by a piezoelectric element disposed between a surface of the supporting member and a surface of the battery cell contacting each other, a pressure applied to the battery cell by the supporting member; and controlling, by a controller, a volume of the piezoelectric element according to the pressure measured by the piezoelectric element, such that the pressure applied to the battery cell is made to be a constant pressure, wherein one of opposite surfaces of the piezoelectric element contacts the supporting member and the other of opposite surfaces of the piezoelectric element contacts the battery cell, and wherein the piezoelectric element controls the pressure applied to the battery cell by the volume change of the piezoelectric element if a pressure between the battery cell and the supporting member is changed according to the volume change of the battery cell.

12. The internal pressure control method of claim 11, wherein the controlling of the volume of the piezoelectric element includes:

converting, by a converter of the controller, a pressure value measured by the piezoelectric element into a first voltage signal;

calculating, by a calculator of the controller, a second voltage signal for changing the battery cell to an initial pressure state using the first voltage signal; and driving, by a driver of the controller, the piezoelectric element according to the second voltage signal.

13. The internal pressure control method of claim 12, wherein the calculating of the second voltage signal includes:

converting, by an analog to digital converter, the first voltage signal to a first digital signal;

converting the first digital signal into a second digital signal for changing the battery cell into the initial pressure state;

converting, by a digital to an analog converter, the second digital signal to a second analog signal; and amplifying, by a signal amplifier, the second analog signal to convert the second analog signal into the second voltage signal.

14. The internal pressure control method of claim 12, wherein the calculating of the second voltage signal includes:

calculating a difference between a first pressure value corresponding to the first voltage signal and a second pressure value that corresponds to the initial pressure of the battery cell; and calculating the second voltage signal corresponding to the calculated difference between the first pressure value and the second pressure value.

15. The internal pressure control method of claim 12, wherein the driving of the piezoelectric element includes:

controlling the pressure applied to the battery cell by transmitting the second voltage signal to the piezoelectric element; and driving the piezoelectric element according to the second voltage signal to change the volume of the piezoelectric element.

\* \* \* \* \*